(12) United States Patent
Kuo et al.

(10) Patent No.: US 8,492,647 B2
(45) Date of Patent: Jul. 23, 2013

(54) ORGANIC SOLAR CELL AND METHOD FOR FORMING THE SAME

(75) Inventors: Pin-Han Kuo, Taipei (TW); Chih-Kung Lee, Taipei (TW); Min-Hua Yang, Taipei (TW); Dong-Sheng Wu, Taipei (TW); Kang-Chuang Lee, Taipei (TW); Shu-Ming Hsieh, Taipei (TW); Po-Cheng Lai, Taipei (TW)

(73) Assignee: National Taiwan University, Taipei (TW)

( * ) Notice: Subject to any disclaimer, the term of this patent is extended or adjusted under 35 U.S.C. 154(b) by 323 days.

(21) Appl. No.: 12/906,847

(22) Filed: Oct. 18, 2010

(65) Prior Publication Data
US 2011/0100466 A1    May 5, 2011

(30) Foreign Application Priority Data
Nov. 5, 2009 (TW) .............................. 98137530 A

(51) Int. Cl.
*H01L 31/00* (2006.01)
(52) U.S. Cl.
USPC ............. 136/263; 136/252; 136/255; 438/57; 438/73; 438/82; 438/93; 438/94

(58) Field of Classification Search
USPC ................ 136/252, 255, 263; 438/57, 73, 82, 438/93, 94
See application file for complete search history.

(56) References Cited

U.S. PATENT DOCUMENTS

| | | | |
|---|---|---|---|
| 2006/0228466 A1* | 10/2006 | Yu et al. | 427/64 |
| 2007/0029547 A1* | 2/2007 | Parker | 257/40 |
| 2007/0040493 A1* | 2/2007 | Sellars et al. | 313/504 |
| 2008/0282921 A1* | 11/2008 | MacPherson et al. | 101/485 |
| 2009/0072713 A1* | 3/2009 | Sant et al. | 313/504 |

* cited by examiner

Primary Examiner — Bac Au

(57) ABSTRACT

The invention provides an organic solar cell, including: a substrate having a first electrode formed thereon; a hole transport layer overlying the first electrode; a metal layer having a first pattern in the hole transport layer; a photoactive layer, including: a first organic semiconductor film having a second pattern complementary to the first pattern and overlying the metal layer and the hole transport layer; a second organic semiconductor film having a first pattern substantially aligned to the first pattern of the metal layer and overlying the first organic semiconductor film, wherein the first organic semiconductor film and the second organic semiconductor film have opposite conductive types; a second electrode overlying the photoactive layer. The invention further provides a method for forming the organic solar cell.

42 Claims, 22 Drawing Sheets

ORGANIC SOLAR CELL AND METHOD FOR FORMING THE SAME

CROSS REFERENCE TO RELATED APPLICATIONS

This application claims priority of Taiwan Patent Application No. 098137530, filed on Nov. 5, 2009, the entirety of which is incorporated by reference herein.

BACKGROUND OF THE INVENTION

1. Field of the Invention

The present invention relates to an organic solar cell, and in particular relates to an organic solar cell which has high photoelectric conversion efficiency.

2. Description of the Related Art

Currently the energy used to generate electricity around the world is based on non-renewable energy, such as petroleum, natural gas, coal or nuclear energy, which causes serious pollution problems. Therefore, non-polluting, renewable energy sources such as hydropower, wind power, geothermal power, ocean energy, biomass energy and solar energy have become more important. Among them, solar energy is most often used to replace the existing non-renewable energy sources due to its wide distribution and easy obtainment.

Light energy is directly absorbed and converted to electric energy by using a solar cell which is made up of solid semiconductor components. The basic structure of the solar cell is the semiconductor pn junction formed by the contact between p and n-type silicon. When sunlight hits the solar cell, the semiconductors absorb photons to excite electron-hole pairs (also refers to excitations). As a result of the internal electric field effect, the holes and electrons respectively transport toward opposite cathode and anode and aggregated. The anode and cathode are electrically connected to output loading circuits and electric power is generated.

At present, the solar cell has developed three generations: the types of first generation are silicon-based solar cells which are based on single crystal silicon, polysilicon, or amorphous silicon; the second generation are the hybrid solar cell which are based on GaAs, CdSe, $CuLnGaSe_2$ and some inorganic semiconductor compounds; the third generation are the organic solar cells which are based on dye-sensitized materials, conducting polymers and conjugated polymers.

The advantages of the organic solar cell include; a simple process, low cost, light weight, flexibleness, large area production and potential for high conversion efficiency (theoretically up to 20% in future). However, the main shortcoming is its low practical conversion efficiency. Thus, there are many approaches to improve the practical photoelectric conversion efficiency of the organic solar cell. Among these approaches are; changing the preparation of materials, carrying out some particular processes (i.e. annealing or film treatments), or adding some specific structures into the solar cell devices.

In Solar Energy Materials and Solar cells, 37, 1995, 337-348, O. Stenzel and A. stendal et al. showed adding a metal film into the organic solar cell, such as coating a thin metal film on the surface of the anode (tin indium oxide), which effectively increased the generation of photocurrent and the photoelectric conversion efficiency of the organic solar cell. The metal film surface excited the production of surface plasmons which may enhance the localized electromagnetic field which increases the photon absorption efficiency of the active layer.

In Applied Physics Letters, 92, 2008, 244304, Anthony J. Morfa and Kathy L. Rowlenam et al showed a method of coating metal nanoparticles on the surface of the anode (tin indium oxide), which further increased the photoelectric conversion efficiency of the organic solar cell.

Therefore, at present, there is a need for an organic soar cell which can further control the effective surface plasmon effects to achieve a higher photoelectric conversion.

BRIEF SUMMARY OF THE INVENTION

A detailed description is given in the following embodiments with reference to the accompanying drawings.

One of the broader forms of an embodiment of the present invention involves an organic solar cell. The organic solar cell includes a substrate having a first electrode thereon; a hole transport layer overlying the first electrode; a metal layer having a first pattern in the hole transport layer; an active layer, including: a second organic semiconductor film having the first pattern substantially aligned to the first pattern of the metal layer and overlying the first organic semiconductor film, wherein the first organic semiconductor film and the second organic semiconductor have opposite conductive types, and a second electrode overlying the active layer.

Another one of the broader forms of an embodiment of the present invention involves a method for forming an organic solar cell. The method includes providing a substrate having a first electrode thereon; forming a hole transport layer and a metal layer on the first electrode, wherein the metal layer has a first pattern; forming an active layer on the hole transport layer, including: forming a first organic semiconductor film having a second pattern complementary to the first pattern on the metal layer and the hole transport layer; and forming a second organic semiconductor film having the first pattern substantially aligned to the first pattern of the metal layer on the first organic semiconductor film, wherein the first organic semiconductor film and the second organic semiconductor have opposite conductive types; and forming a second electrode on the active layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
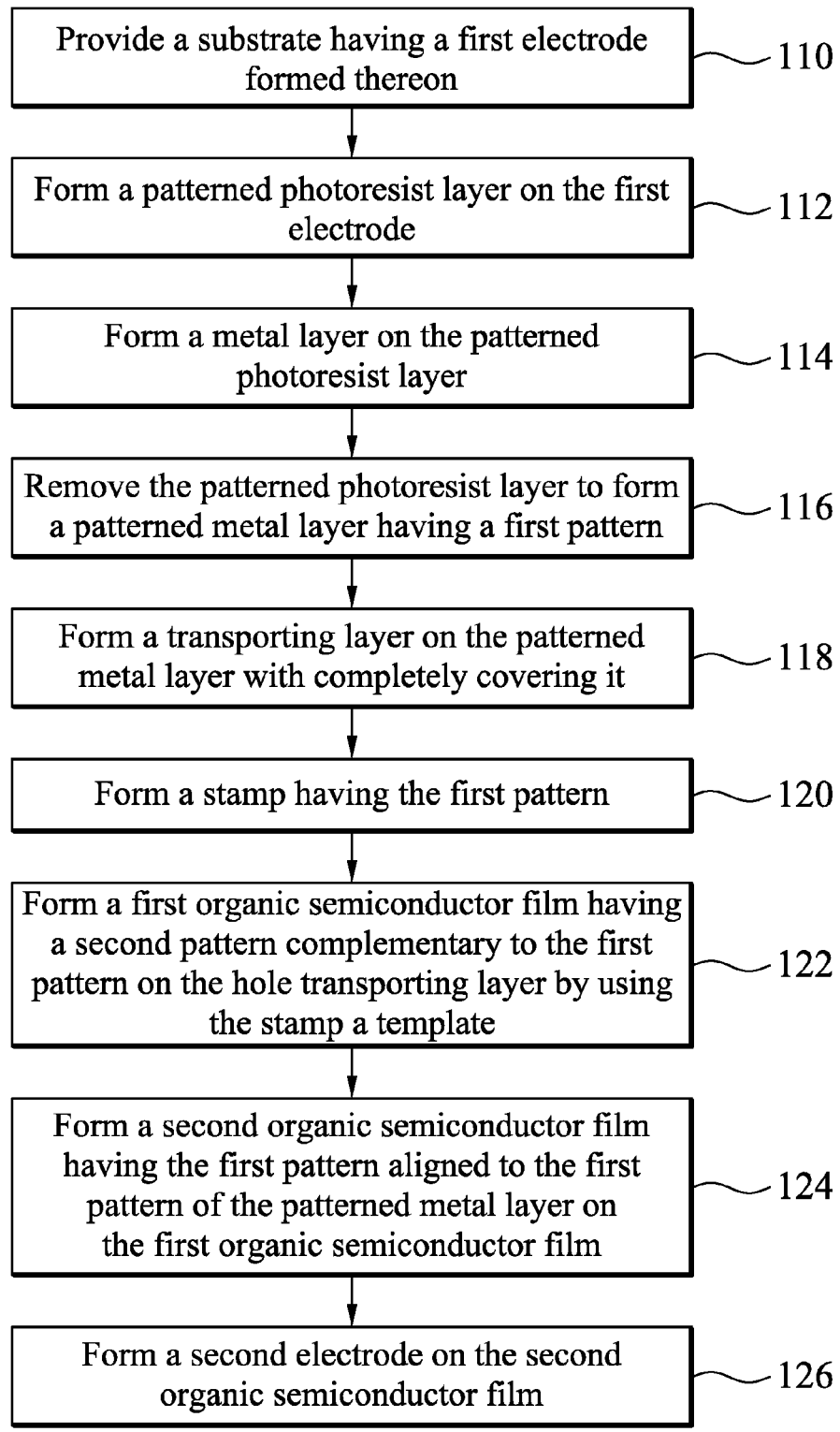
FIG. 1 is a flowchart illustrating a method for forming an organic solar cell according to one embodiment of the present disclosure.

The following description is of the best-contemplated mode of carrying out the invention. This description is made for the purpose of illustrating the general principles of the invention and should not be taken in a limiting sense. These are, of course, merely examples and are not intended to be limiting. For example, the formation of a first feature over, above, below, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

Figure 2A:
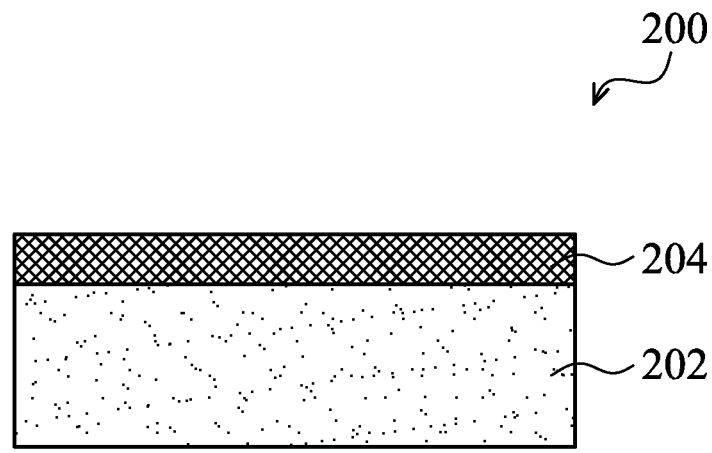
FIGS. 2A to 2K are cross-sectional views of an organic solar cell at various steps of fabrication according to the method of FIG. 1.
Figure 2B:
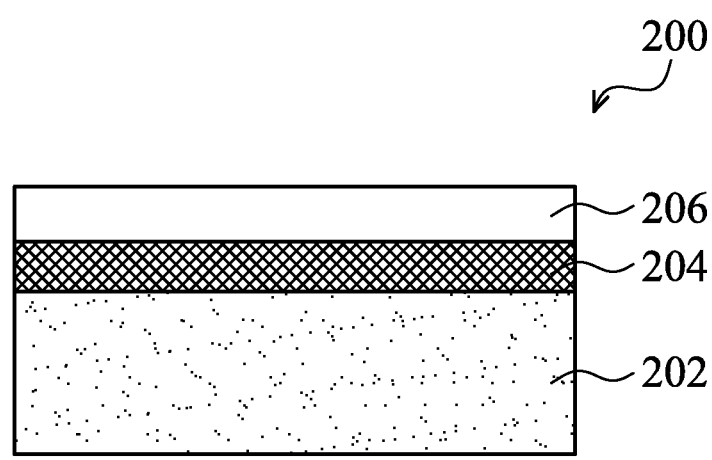
Figure 2C:
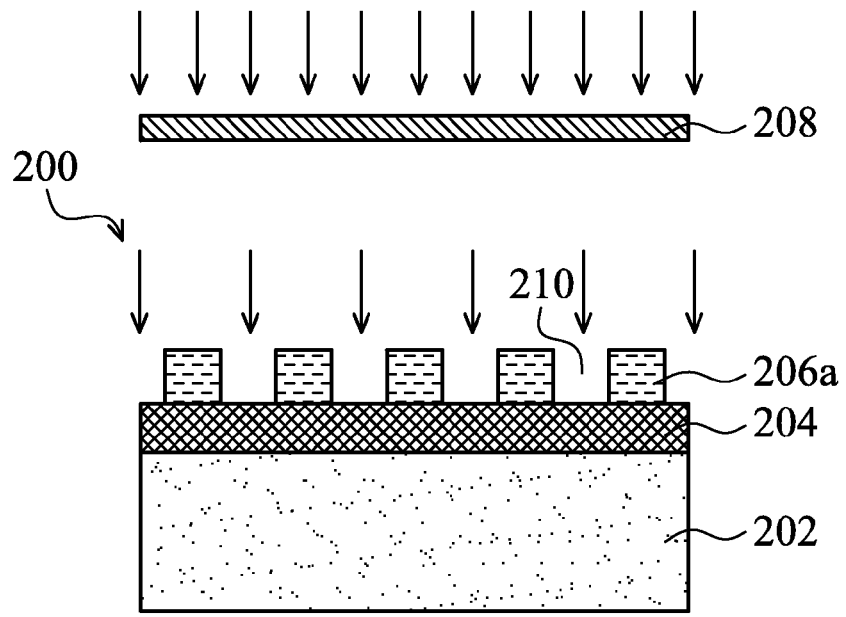
Figure 2D:
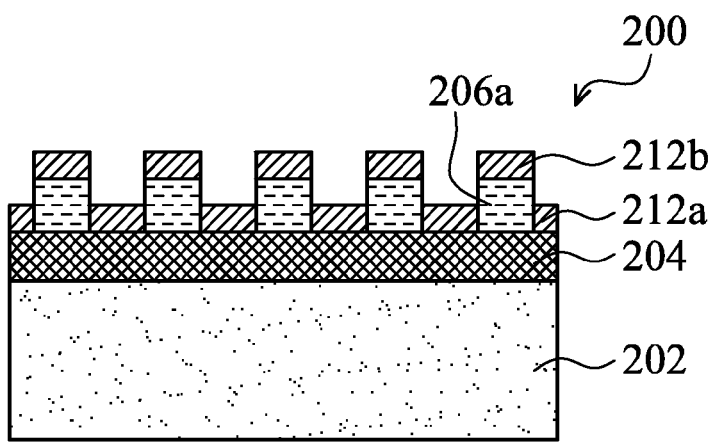
Figure 2E:
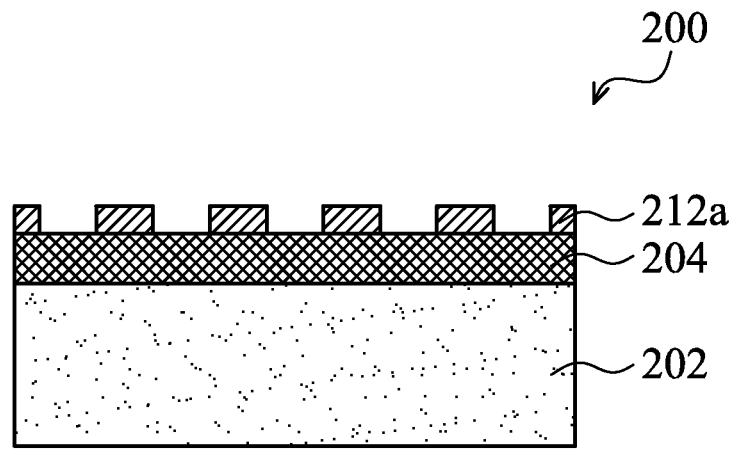
Figure 2F:
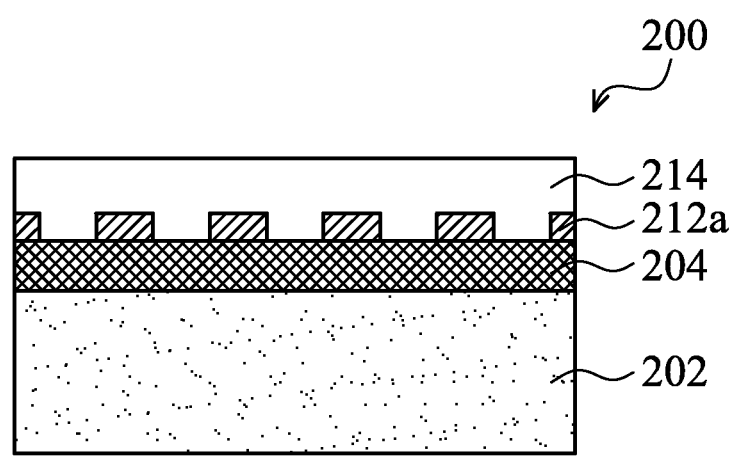
Figure 2G:
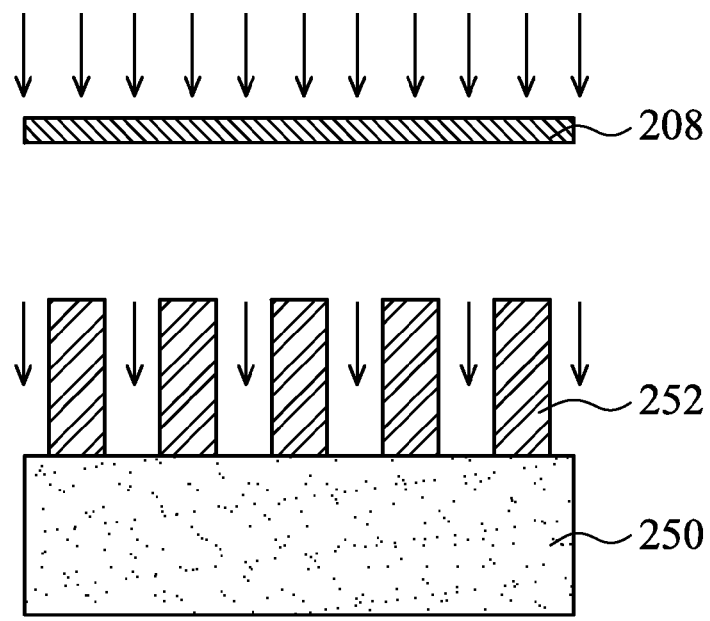
Figure 2H:
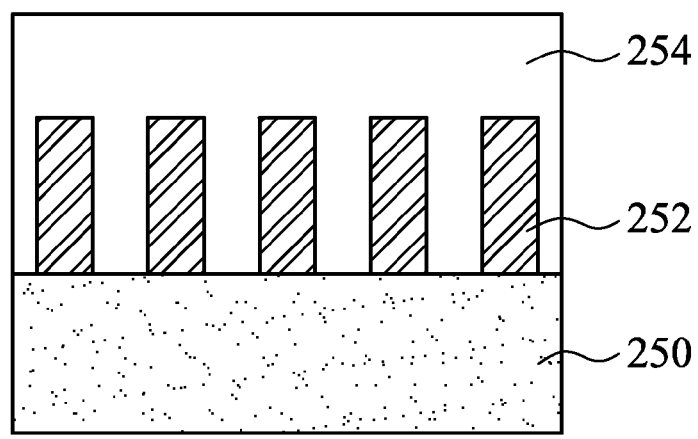
Figure 2I:
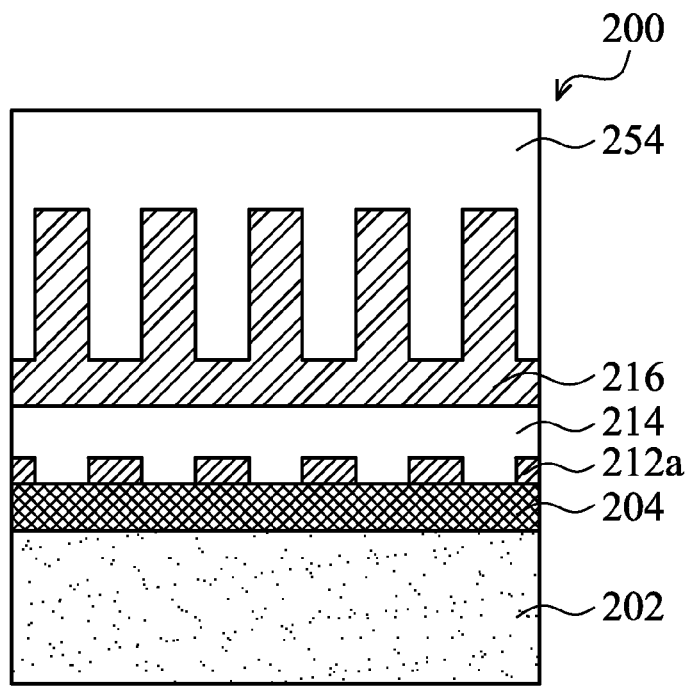
Figure 2J:
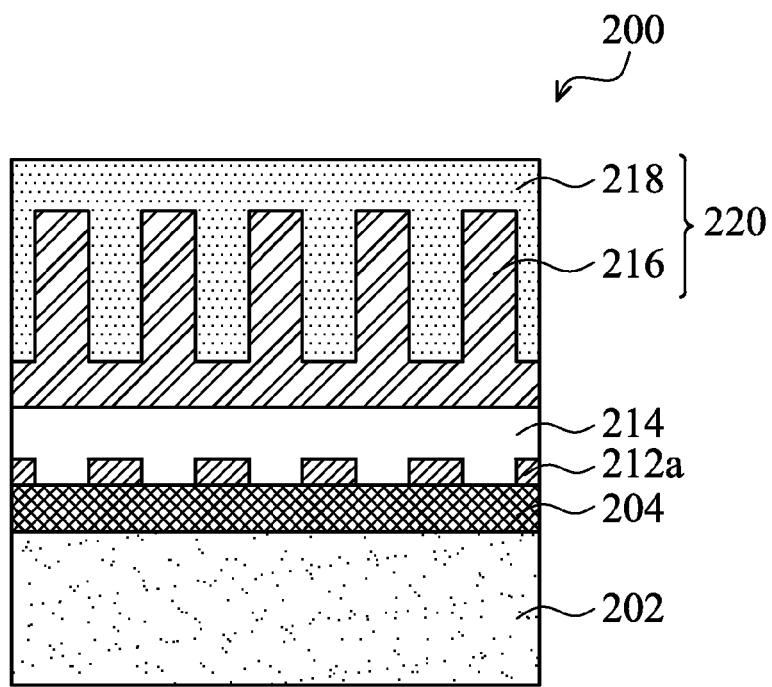
Figure 2K:
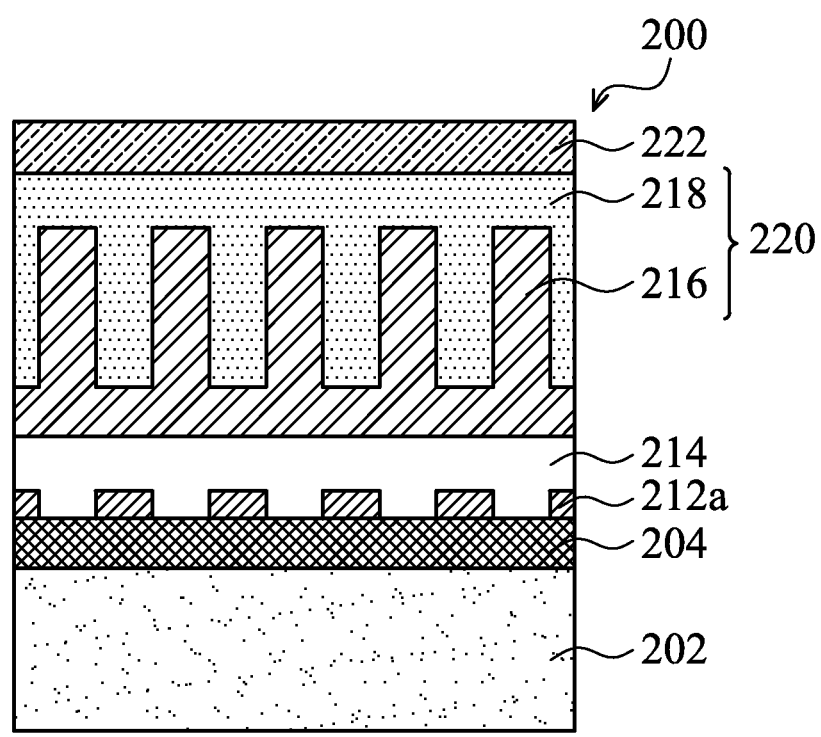

The present invention provides an organic solar cell, FIG. 2K, illustrates an organic solar cell according to one embodiment of the present disclosure and includes a substrate 202, patterned metal layer 206a, hole transport layer 214, active layer 220 consisting of a first organic semiconductor film 216 and second organic semiconductor film 218 and second electrode 222, wherein the second organic semiconductor film 218 has a first pattern which is the same as the first pattern of the patterned metal layer 206a and complementary to a second pattern of the first organic semiconductor film 216. Furthermore, the first pattern of the second organic semiconductor layer 218 is substantially aligned to the first pattern of the patterned metal layer 216a. The photon absorption efficiency of the active layer is increased while the first pattern of the second organic semiconductor layer 2168 is aligned to the first pattern of the patterned metal layer 216a because the pattern corresponds to the localized magnetic field enhanced by the surface plasmons excited by the patterned metal layer 206a. The photoelectric conversion efficiency of the organic solar cell device 200 is increased.

Referring to FIG. 1, illustrated is a flowchart of a method 100 for forming an organic solar cell according to one embodiment of the present disclosure. Referring also to FIG. 2A to 2K, illustrated are cross-sectional views of an organic solar cell at various steps of fabrication according to the method 100 of FIG. 1.

Method 100 begins with block 110 in which a substrate having a first electrode is provided. In FIG. 2A, the substrate 202 may be a hard substrate or flexible substrate, preferably, with a transmittance above 70% under visible light. For example, the substrate 202 may be a glass substrate or a transparent flexible plastic substrate. The substrate 202 may include a first electrode 204 formed thereon. The first electrode 204 may be a transparent conductive layer, such as tin oxide, zinc oxide, indium tin oxide (ITO), indium zinc oxide (IZO), antimony tin oxide (ATO), fluorine doped tin oxide (FTO), aluminum doped zinc oxide (AZO) or combinations thereof. In present embodiment, the first electrode 204 may function as an anode of the organic solar cell.

Figure 7A:
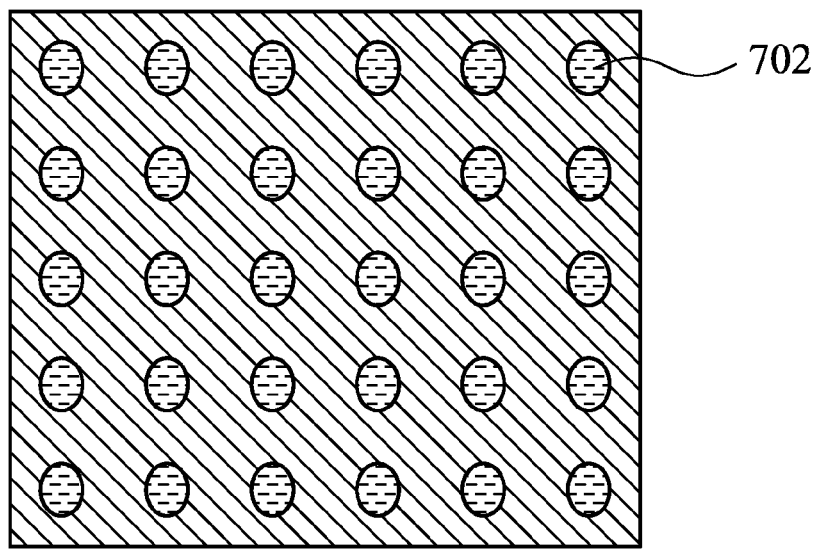
FIGS. 7A to 7E are schemes illustrating the shapes and arrangements of the patterns of the active layer of an organic cell according to one embodiment of the present disclosure.
Figure 7B:
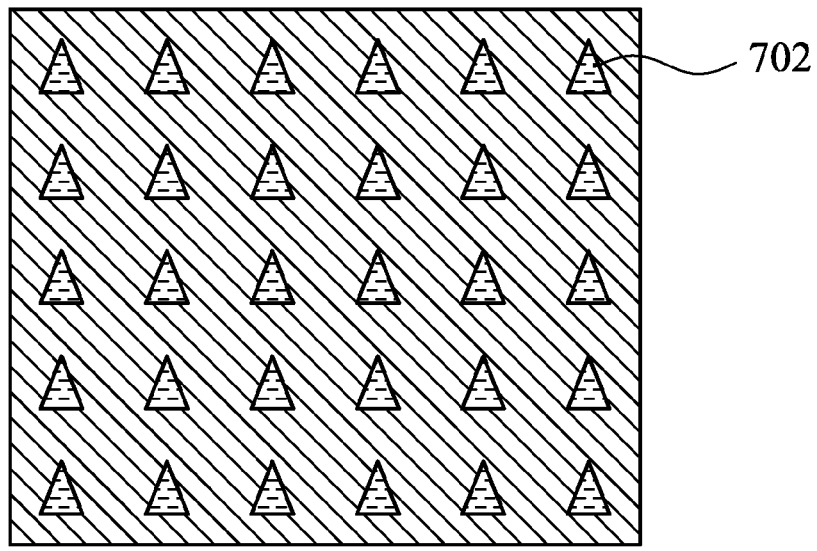
Figure 7C:
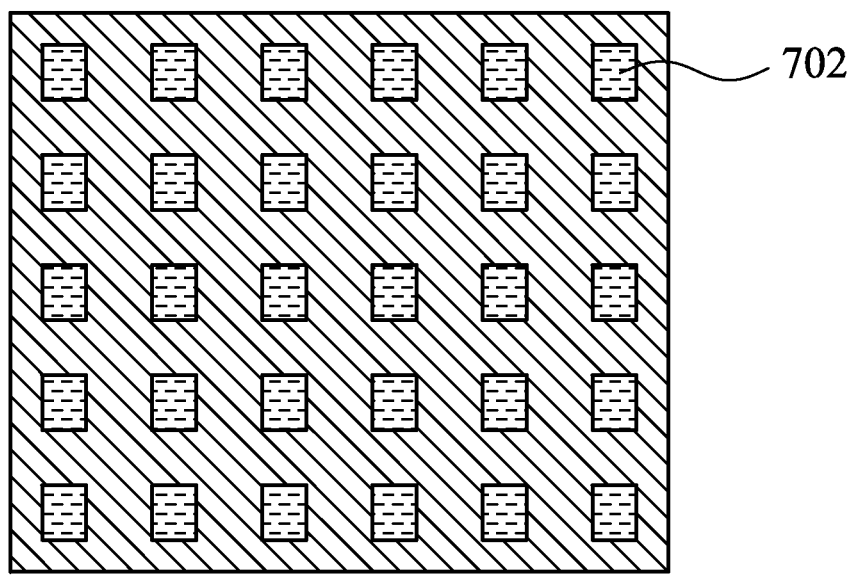
Figure 7D:
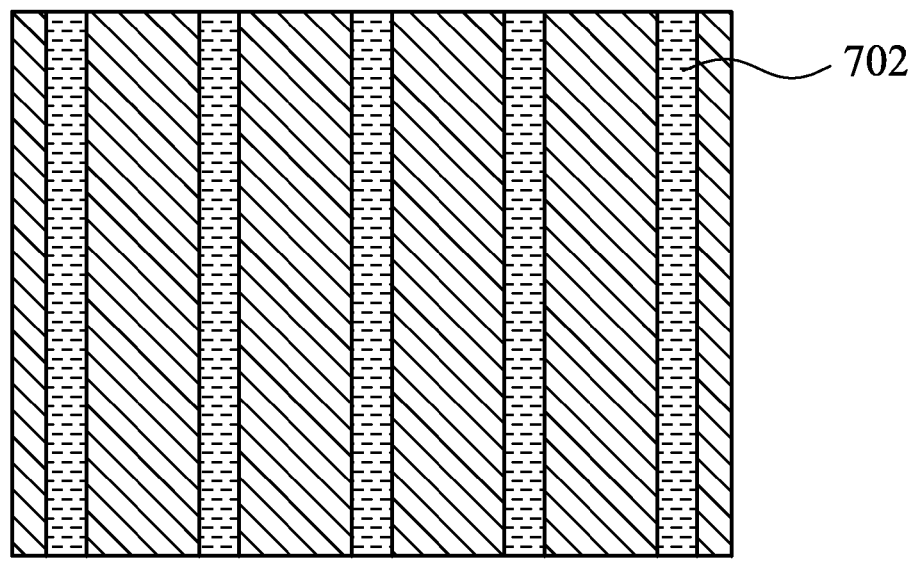
Figure 7E:
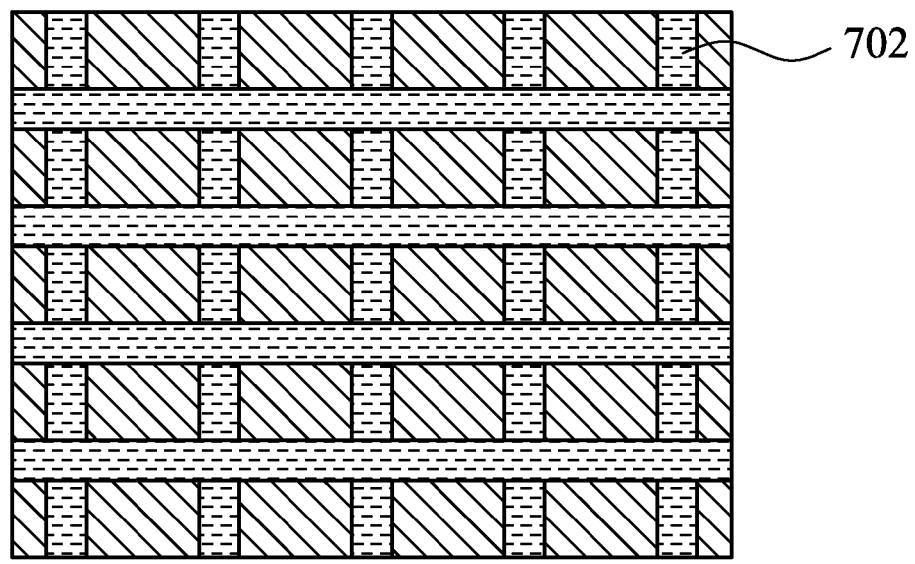

Method 100 continues with block 112 in which a patterned photoresist layer is formed on the first electrode. In FIG. 2B, a photoresist layer 206 is formed on the first electrode 204. In FIG. 2C, the photoresist layer 206 is patterned to form a patterned photoresist layer 206a and the openings 210 by using a mask 208 having a first pattern as a template. The photoresist layer 206 may be defined by electron beam writing, ion beam writing, photolithography, immersion lithography or any other suitable patterning techniques. The first pattern 702 may include various shapes such as circles, triangles, rectangles, star shapes, polygons or straight lines, as shown in FIG. 7A-FIG. 7C. The size of the openings 210 is between about 1 nm and 1 mm. The first pattern 702 may be arranged periodically in one or two dimensions with a distance between about 1 nm and 1 mm, as shown in FIG. 7D-FIG. 7E. The openings 210 may have a first pattern and expose a portion of the surface of first electrode 204. The patterned photoresist layer 206a has a second pattern complementary to the first pattern. The patterned photoresist layer 206a may have a thickness between about 1 nm and 1 mm, preferably between about 10 nm and 100 μm.

The method continues with block 114 in which a metal layer is formed on the photoresist layer and in the openings. Referring to FIG. 2D, metal layers 212a, 212b are deposited on the photoresist layer 206a and in the openings 210. Metal layers 212a, 212b may include gold, silver, copper, aluminum, chromium, alloys thereof or combinations thereof. Metal layers 212a, 212b may be formed by spin coating, sputtering, chemical vapor deposition (CVD), physical vapor deposition (PVD), atom layer deposition (ALD) or other suitable deposition techniques. In one embodiment, metal layers 212a, 212b may have a thickness between about 1 nm and 1 mm, and preferably between about 10 nm and 100 μm. In one alternative embodiment, a surface treatment such as $O_2$ plasma, self-assembled monolayer or organic solutions pretreatment is performed on the first electrode 204 to modify the interface adhesion and the contact photoresist between the first electrode 204 and metal layer 212a before the deposition of the metal layers 212a, 212b.

Method 100 continues with block 116 in which the patterned photoresist layer is removed by such as a lifting-off method to form a patterned metal layer. In FIG. 2E, the patterned photoresist layer 206a and the metal layer 212b deposited thereon are lifted-off by a developer. Accordingly, the metal layer 212a may also have the first pattern same with the openings 210.

Method 100 continues with block 118 in which a hole transport layer is formed on the patterned metal layer and the first electrode. In FIG. 2F, a hole transport layer 216 is formed on the patterned metal layer 212a and the first electrode 204 completely covers the patterned metal layer 212a. The work function of the first electrode 204 may be modified by the hole transport layer 214 which may reduce the hole injection barrier and block electrons, and the hole transport efficiency is thus improved. In one embodiment, the hole transport layer 214 may include transparent conductive polymers such as 3,4-polyethylenedioxythiophene: polystyrene sulfonate (PEDOT: PSS), poly[9,9-dioctylfluorene-co-(bis-N,N'-(3-carboxyphenyl)-bis-N,N'-phenylbenzidine)] (BFA), polyaniline (PAN), polyphenylenevinylene (PPV), N,N'-bis-(3-methylphenyl)-N,N'-diphenyl-[1,1'-biphenyl]-4,4'-diamine (TPD), N-N'-di(naphthalene-1-yl)-N,N'-diphenylbenzidine (NPB), N,N'-bis-(3-methylphenyl)-N,N'-bis-(phenyl)-9,9-spirobifluorene (spiro-TPD), N-N'-Bis(naphthalen-1-yl)-N, N'-bis(phenyl)-9,9-spirobifluorene (spiro-NPB) or combinations thereof. The hole transport layer 214 may be formed by spin coating, doctor blade coating, roll coating, ink-jet coating, screen coating or any other suitable coating methods. It should be noted that the thickness of the hole transport layer 214 is preferably thicker than patterned metal layer 212a for completely covering the patterned metal layer 212a.

Method 100 continues with block 120 in which a stamp having the first pattern is formed. Referring to FIG. 2G, another substrate 250 is provided and another patterned photoresist layer 252 is formed thereon by using the mask 208 having the first pattern as a template. Thus, the patterned photoresist layer 252 may have the first pattern. The substrate 250 and the patterned photoresist layer 252 herein may include similar materials with the substrate 202 and the patterned photoresist layer 208 described above or any other suitable materials. The patterned photoresist layer 252 may be formed by any suitable lithography methods, such as electron beam writing, ion beam writing, photolithography, immersion lithography or any other suitable methods. In FIG. 2H, a stamp 254 is formed on the patterned photoresist layer 252 by using the patterned photoresist layer 252 as a template. The stamp 254 is formed by filling a solution of the stamp materials into the patterned photoresist layer 252 and curing the stamp materials. The stamp 254 may have the first pattern same with the patterned photoresist layer 252. The stamp 254 may include polydimethylsiloxane (PDMS), UV-curable liquids, water soluble polymers, polyurethane (PU) or other material curable by heat or light or combinations thereof.

Method 100 continues with block 122 in which a first organic semiconductor film is formed on the hole transport layer. In FIG. 2I, a non-patterned organic semiconductor film is formed on the hole transport layer 214. The non-patterned organic semiconductor film may be formed by spin coating, sputtering, chemical vapor deposition (CVD), physical vapor deposition (PVD), atom layer deposition (ALD) or any other suitable deposition methods. Thereafter, the non-patterned organic semiconductor film is softened by heating and the stamp 254 is pressed to the non-patterned organic semiconductor film. Accordingly, after removing the stamp, a first organic semiconductor film 216 having a second pattern is formed, wherein the second pattern is complementary to the first pattern. The first organic semiconductor film 216 may include poly(3-hexylthiophene) (P3HT), (6,6)-phenyl C61-butyric acid methyl ester (PCBM), Poly(2-methoxy-5-(2-ethylhexyloxy)-1,4-phenylenevinylene (MEHPPV), poly[2-methoxy-5-(3,7-dimethyloctyloxy)-1,4-phenylenevinylene] (MDMO-PPV), poly[N-9'-heptadecanyl-2-7-carbazole-alt-5,5-(4'-7'-di-2'-1',3'-benzothiadiazole)] (PCDBT), poly[2,6-(4,4-bis(2-ethylhexyl)-4H-cyclopenta[2,1-b:3,4-b']dithiophene)-alt-4,7-(2,1,3-benzothiadiazole)]) (PCPDTBT), poly[4,4-bis(2-ethylhexyl)-4H-cyclopenta[2,1-b:3,4-b']dithiophene-2,6-diyl-alt-4,7-bis(2-thienyl)-2,1,3-benzothiadiazol5',5"-diyl] (PCPDTTBTT) or combinations thereof. It should be noted that the first pattern of the stamp 254 is substantially aligned to the first pattern of the metal layer 212a, such that the stamp first organic semiconductor film 216 formed in the interstice of the stamp 254 may have the second pattern complementary to the first pattern of the metal layer 212a.

Method 100 continues with block 124 in which a second organic semiconductor film is formed on the first organic semiconductor film. Referring to FIG. 2J, the stamp 254 is removed after the formation of the first organic semiconductor film 216. A second organic semiconductor film 218 is deposited on the first organic semiconductor film 216 and completely covers it. Accordingly, the first organic semiconductor film 216 and the second organic semiconductor film 218 are interlocked. The second organic semiconductor film 218 may have the first pattern complementary to the second pattern of the first organic semiconductor film 216 as well as substantially aligned to the first pattern of the metal layer 212a. At least one of the first organic semiconductor film 216 or the second organic semiconductor film 218 may include a light-absorbing material. The second organic semiconductor film 218 may include poly(3-hexylthiophene) (P3HT), (6,6)-phenyl C61-butyric acid methyl ester (PCBM), Poly(2-methoxy-5-(2-ethylhexyloxy)-1,4-phenylenevinylene (MEH-PPV), poly[2-methoxy-5-(3,7-dimethyloctyloxy)-1,4-phenylenevinylene] (MDMO-PPV), poly[N-9'-heptadecanyl-2-7-carbazole-alt-5,5-(4'-7'-di-2'-1',3'-benzothiadiazole)] (PCDBT), poly[2,6-(4,4-bis(2-ethylhexyl)-4H-cyclopenta[2,1-b:3,4-b']dithiophene)-alt-4,7-(2,1,3-benzothiadiazole)]) (PCPDTBT), poly[4,4-bis(2-ethylhexyl)-4H-cyclopenta[2,1-b:3,4-b']dithiophene-2,6-diyl-alt-4,7-bis(2-thienyl)-2,1,3-benzothiadiazol5',5"-diyl] (PCPDTTBTT) or combinations thereof. The second organic semiconductor 218 may be formed by spin coating, sputtering, chemical vapor deposition (CVD), physical vapor deposition (PVD), atom layer deposition (ALD) or any other suitable techniques. In one embodiment, the first organic semiconductor film 216 is n-type while the second organic semiconductor film 218 is p-type. In another embodiment, the first organic semiconductor film 216 is p-type while the second organic semiconductor film 218 is n-type. An active layer 220 is consisted of the first organic semiconductor film 216 and the second organic semiconductor film 218.

Finally, method 100 continues with block 126 in which a second electrode is formed on the active layer. In FIG. 2K, a second electrode 222 is formed on the active layer 220 to form a complete organic solar cell 200. The second electrode 222 may include a metal or alloy having a relative low work function, such as aluminum, lithium, magnesium, calcium, indium, potassium, alloys thereof or combinations thereof. In one embodiment, the second electrode may include a plurality of layers which consist of different materials, such as aluminum/calcium, magnesium/indium, indium/silver, magnesium/lithium, aluminum/calcium, aluminum/silver, aluminum/lithium or combinations thereof. In the present embodiment, the second electrode 222 may be formed from the layers which consist of aluminum/calcium. The second electrode 222 may function as a cathode of the organic cell.

Figure 3:
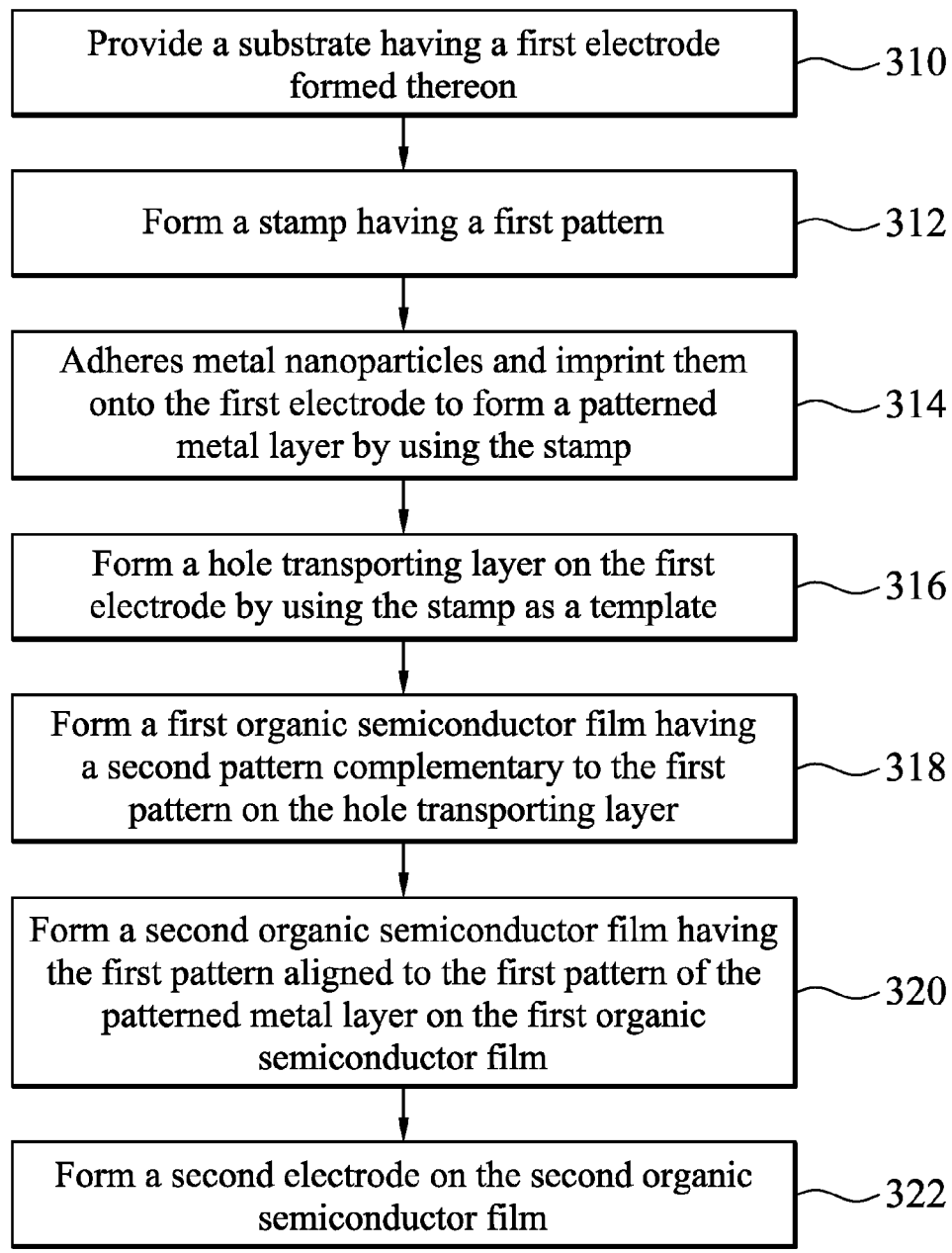
FIG. 3 is a flowchart illustrating a method for forming an organic solar cell according to another embodiment of the present disclosure.

Referring to FIG. 3, illustrated is a flowchart of a method 300 for forming an organic solar cell according to another embodiment of the present invention. Referring also to FIG. 4A to 4k, illustrated are cross-sectional views of an organic solar cell at various steps of fabricating according to method 300 of FIG. 3. In this embodiment, a patterned metal layer is formed on an electrode by imprinting metal nanoparticles onto the electrode using a stamp. Without removing the stamp, a hole transport layer and a first organic semiconductor film are then formed in the interstice of the stamp. A second organic semiconductor film deposited on the first organic semiconductor film has the same pattern with the patterned metal layer, wherein the pattern of second organic semiconductor pattern is self-aligned to the pattern of the patterned metal layer.

Figure 4A:
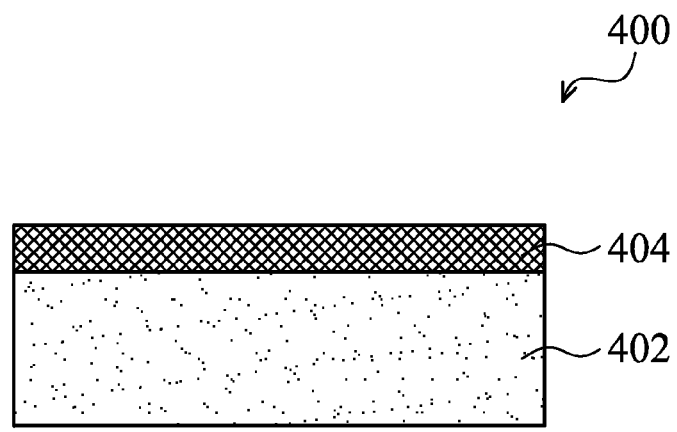
FIGS. 4A to 4I are cross-sectional views of an organic solar cell at various steps of fabrication according to the method of FIG. 3.

Method 300 begins with block 310 in which a substrate having a first electrode is provided. In FIG. 4A, a substrate 402 is provided. The substrate 402 may be similar to the substrate 202 described above. For example, the substrate 402 may be a hard substrate or flexible substrate, preferably, with a transmittance above of 70% under visible light. A first electrode 404 is formed on the substrate 402. The first electrode 404 may include a similar material with the first electrode 204 described above.

Figure 4B:
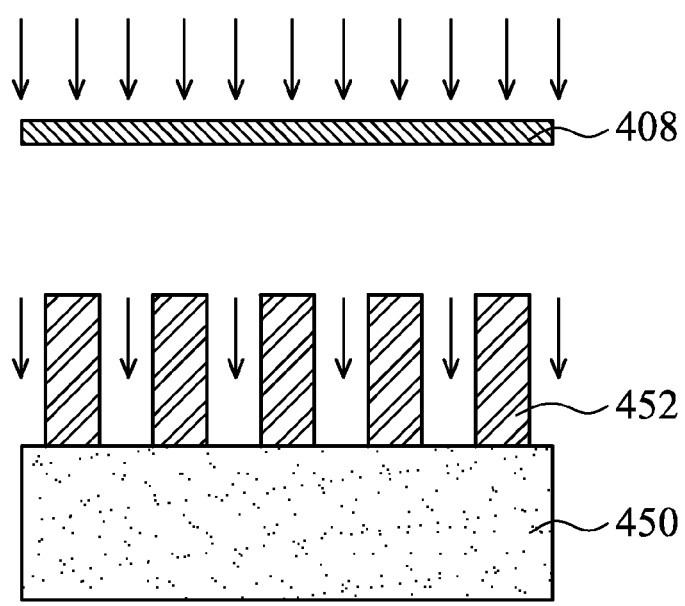
Figure 4C:
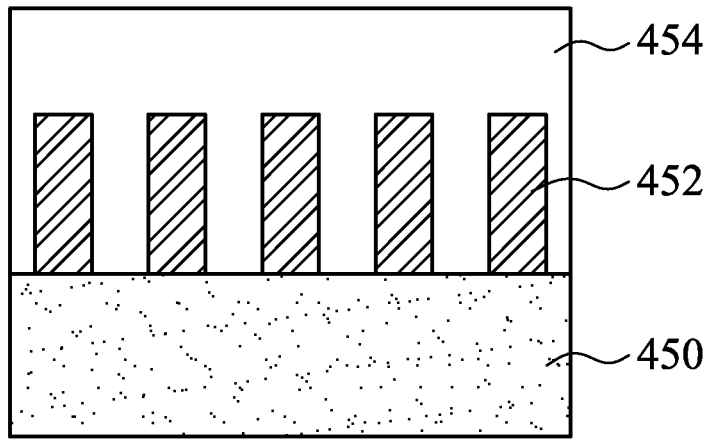

Method 300 continues with the block 312 in which a stamp having a first pattern is formed. In FIG. 4B, another substrate 450 is provided. A patterned photoresist layer 452 is formed on the substrate 450 by using a mask 408 having a first pattern as a template. Thus, the patterned photoresist layer 452 may have the first pattern. The first pattern 702 may include various shapes, such as circles, triangles, rectangles, star shapes, polygons or straight lines, as shown in FIG. 7A-FIG. 7C. The size of the first pattern 702 is between about 1 nm and 1 mm. The first pattern 702 may be arranged periodically in one or two dimensions in a period between about 1 nm and 1 mm, as shown in FIG. 7D-FIG. 7E. The substrate 450 and patterned photoresist layer 452 may include similar materials with the substrate 250 and patterned photoresist layer 252 or any other suitable materials. The patterned photoresist layer 452 may be formed by various suitable lithography techniques, such as electron beam writing, ion beam writing, photolithography, immersion lithography or any other suitable patterning techniques. In FIG. 4C, a stamp 254 is formed on the patterned photoresist layer 452 by using the patterned photoresist layer 452 as a template. The stamp 454 may be formed by filling a solution of stamp materials into the patterned photoresist layer 452 and curing the stamp materials by heating. The stamp 454 may have the first pattern which is the same as the patterned photoresist layer 452. The stamp 454 may include polydimethylsiloxane (PDMS), UV-curable liquids, water-soluble polymers, polyurethane, or other suitable material curable by light or heat or combinations thereof.

Figure 4D:
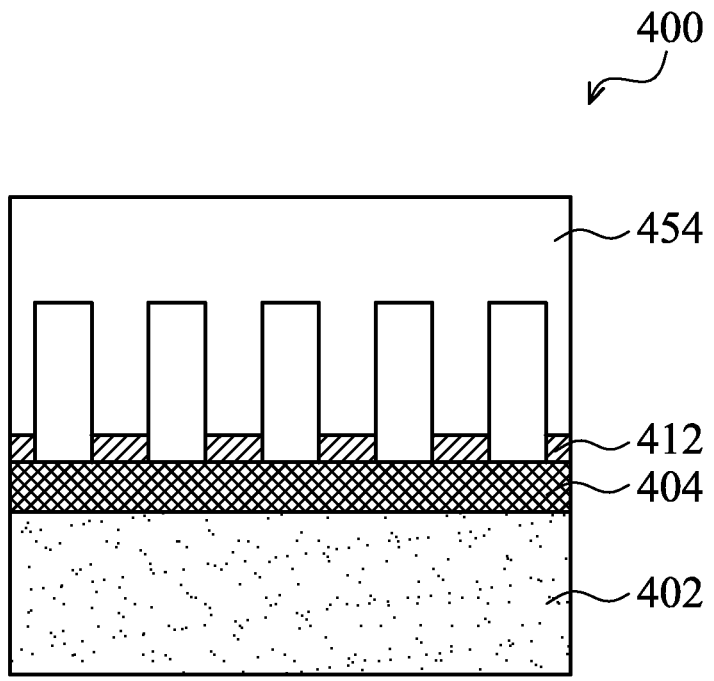

Method 300 continues with block 314 in which a patterned metal layer is formed on the first electrode by sticking metal nanoparticles to a stamp and imprinting them onto the first electrode using the stamp. In FIG. 4D, heated metal nanoparticles are adhered to the stamp 454 having the first pattern and imprinted onto first electrode 404 using the stamp 454. Thus, the metal nanoparticles adherent on the stamp 454 may be transfered to the surface of the first electrode 412. After cooling the metal nanoparticles, a patterned metal layer 412 having the first pattern is formed. In one alternative embodiment, a surface treatment such as dipping the first electrode into 3-(aminopropyl)trimethoxtsilane (APTMS) or in self-assembled monolayer surface modifying solution may be performed to enhance the interface adhesion and contact photoresist between the patterned metal layer 412 and first electrode 404. The patterned metal layer 412 may have a thickness of about 1 nm and 1 mm, preferably between about 10 nm and 100 µm.

Figure 4E:
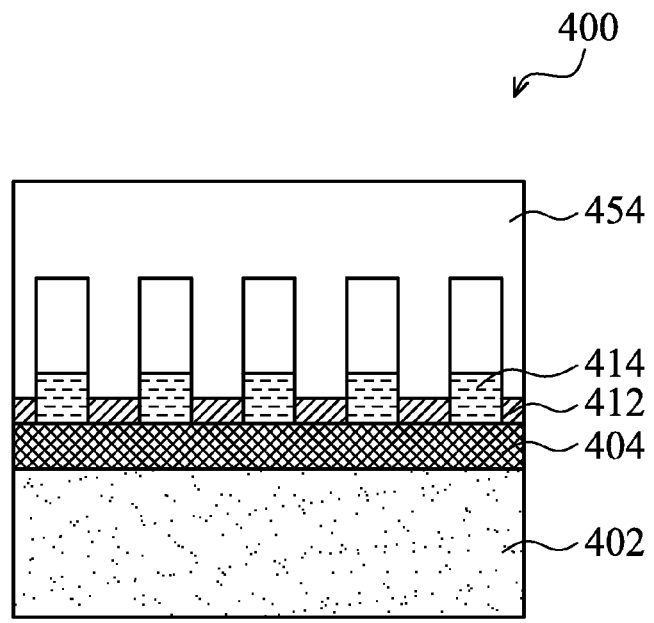
Figure 4F:
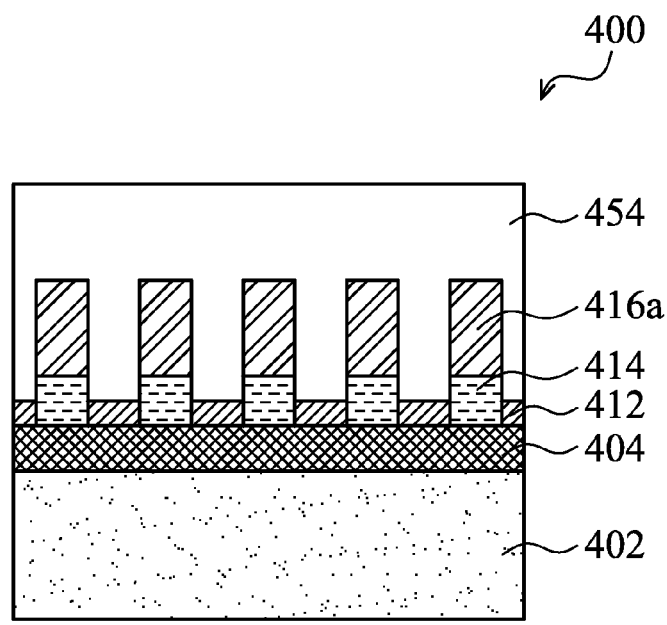

Method 300 continues with block 316 in which a hole transport layer is formed in the interstice of the stamp by using the stamp as a template. Referring to FIG. 4E, a hole transport layer 414 is formed by filling hole transport materials into the interstice of the stamp 454. The hole transport layer 414 may include material which is similar to that of the hole transport layer 214 described above. It should be noted that the hole transport layer 414 has a second pattern complementary to the patterned metal layer 412. The hole transport layer 414 may have a thickness of about 1 nm and 1 mm, preferably between about 10 nm and 100 µm. The thickness of the hole transport layer 414 is preferably thicker than the patterned metal layer 412.

Figure 4G:
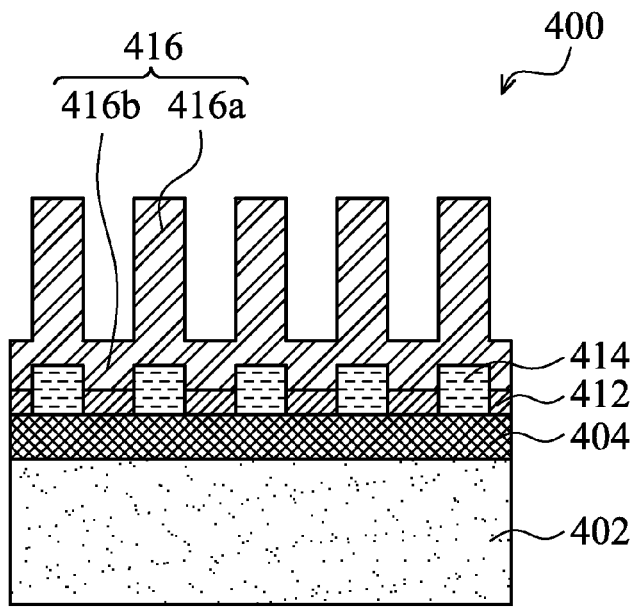

Method 300 continues with block 318 in which a first organic semiconductor film is formed on the hole transport layer and the patterned metal layer. Referring to the FIG. 4F, an organic semiconductor material 410a is filled into the interstice of the stamp 454 (on the hole transport layer 414), wherein the semiconductor material 410a has a second pattern complementary to the first pattern. In FIG. 4G, the stamp 454 is removed. A thin organic semiconductor material 410b is deposited on the metal layer 416 to form a first organic semiconductor film 416 which has the second pattern. Furthermore, the thickness of the deposited organic semiconductor material 416b may be thinner than the filled organic semiconductor material 416a such that the second pattern of the first organic semiconductor film 416 is maintained. Herein the organic semiconductor material 416a and organic semiconductor material 416b consist of the same materials which are also similar to the first organic semiconductor film 210 described above. It should be noted that the second pattern of the first organic semiconductor film 416 is self-complementary to the first pattern of the patterned metal layer 412.

Figure 4H:
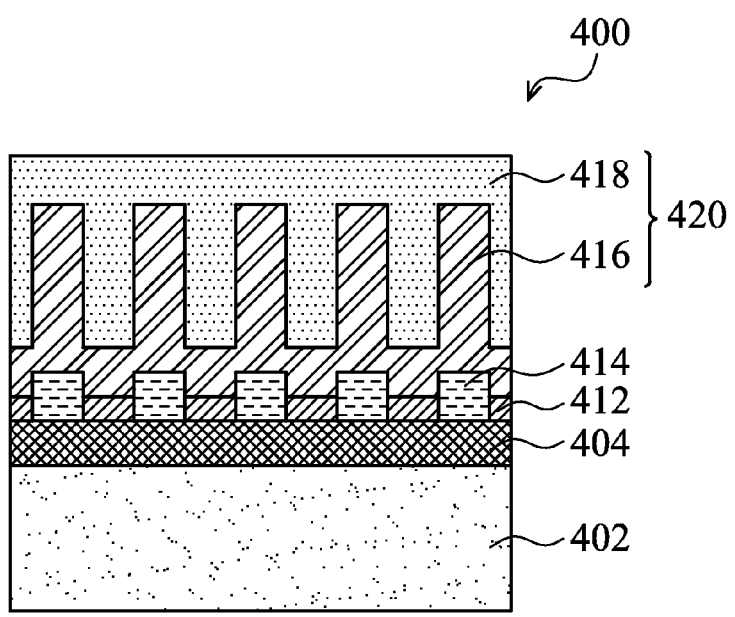
Figure 4I:
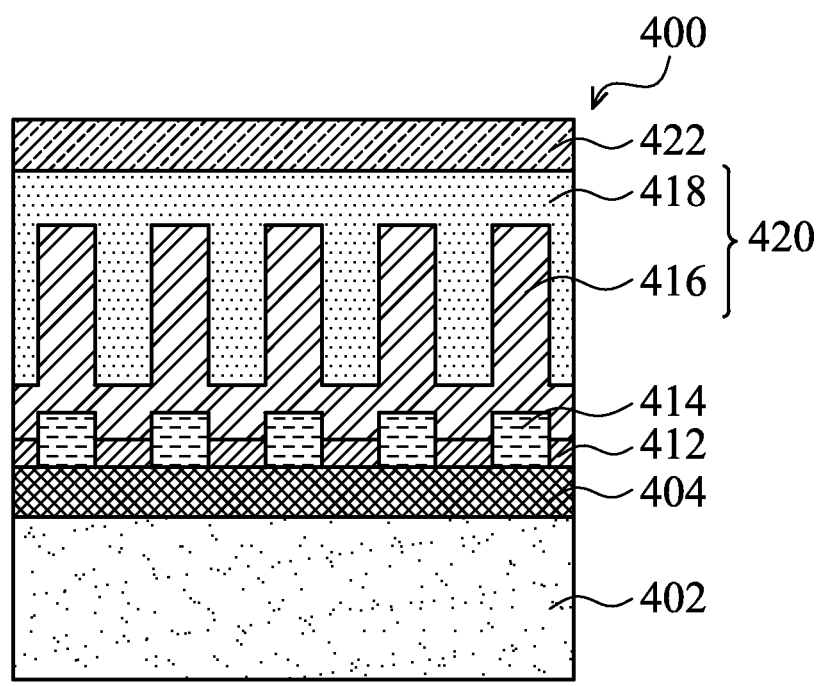

Method 300 continues with block 320 in which a second organic semiconductor film is formed on the first organic semiconductor film. In FIG. 4H, a second organic semiconductor film 418 is formed on the first organic semiconductor film 416 and completely covers it. The second organic semiconductor film 418 may include material which is similar to the material used in the second organic semiconductor film 218 described above. It may also be formed using similar techniques. The first organic semiconductor film 416 and the second organic semiconductor film 418 are interlocked. Furthermore, the first pattern of the first organic semiconductor film 416 is self-aligned to the first pattern of the patterned metal layer 412. At least one of the first organic semiconductor film 416 or second organic semiconductor film 418 may include a light-absorbing material. In one embodiment, the first organic semiconductor film 416 is n-type while the second organic semiconductor film 418 is p-type. In another embodiment, the first organic semiconductor film 416 is p-type while the second organic semiconductor film 418 is n-type. An active layer 420 consists of the first organic semiconductor film 416 and the second organic semiconductor film 418.

Finally, the method continues with block 322 in which a second electrode is formed on the active layer. In FIG. 4E, a second electrode 422 is formed on the active layer 420 and a complete organic solar cell 400 is formed. The second electrode 222 may include a similar material with the second electrode 222 described above as well as be formed by a similar technique.

Figure 5:
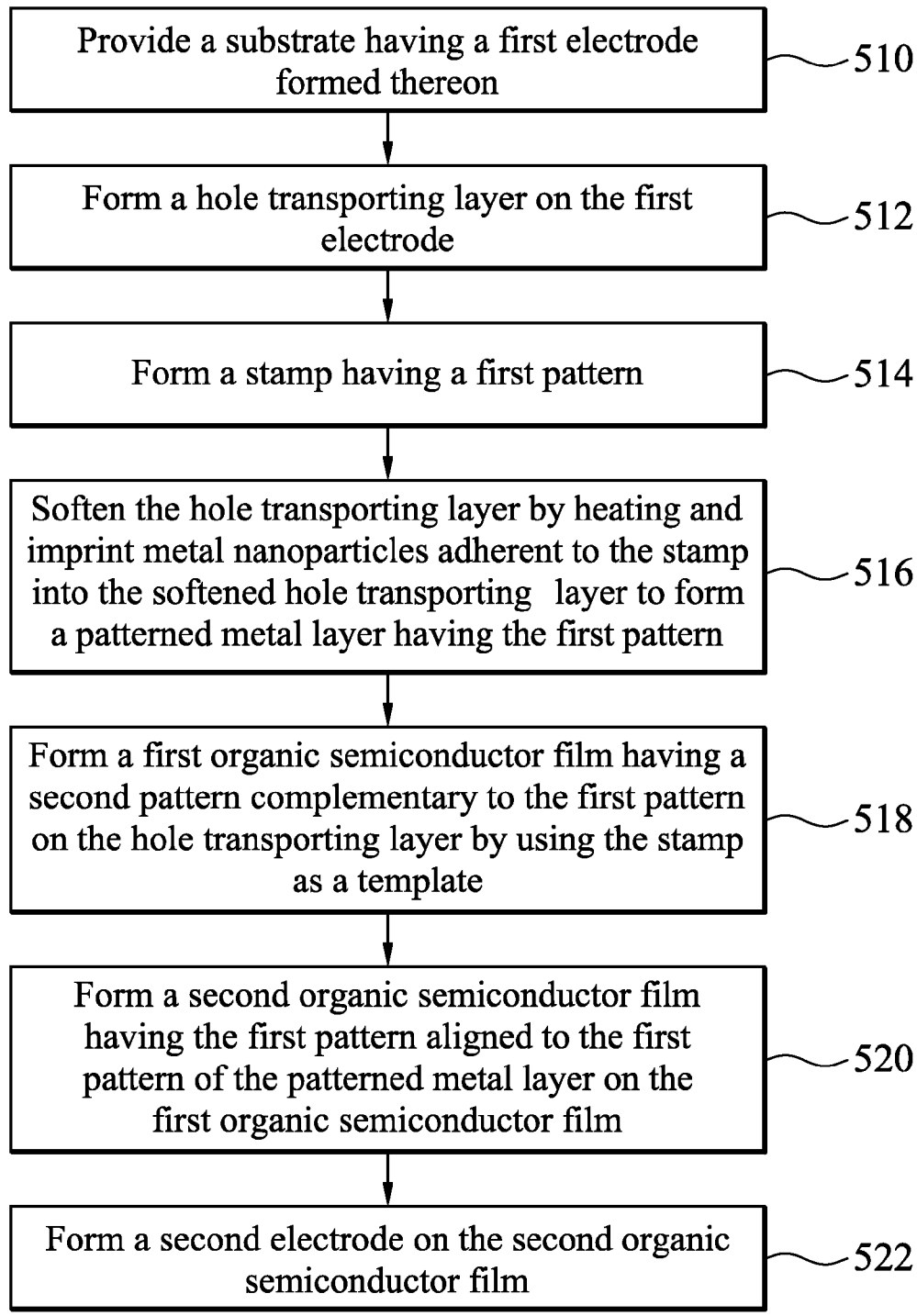
FIG. 5 is a flowchart illustrating a method for forming an organic solar cell according to yet another embodiment of the present disclosure.

Referring to FIG. 5, illustrated is a flowchart of method 500 for forming an organic solar cell according to yet another embodiment of the present invention. Referring also to FIG. 6A to 6F, illustrated are cross-sectional views of an organic solar cell at various steps of fabricating according to method 500 of FIG. 5. In this embodiment, a softened hole transpor layer is formed on an electrode. Metal nanoparticles adhered on a stamp are thermally imprinted into the softened hole transport layer to form a patterned metal layer. Without removing the stamp, a first organic semiconductor film is then formed in the interstice of the stamp. Accordingly, a second organic semiconductor deposited on the first organic semiconductor film has the same pattern as the patterned metal layer which is self-aligned to.

Method 500 begins with block 510 in which a substrate having a first electrode formed thereon is provided. Referring to FIG. 6, a substrate 402 is provided. The substrate 402 is similar to the substrate 202 described above. For example, the substrate 402 may be a hard substrate or fixable substrate, preferably, with a transmittance above of 70% under visible light. A first electrode 604 is formed on the substrate 602. The first electrode 604 may include a similar material with the first electrode 204 described above.

Figure 6A:
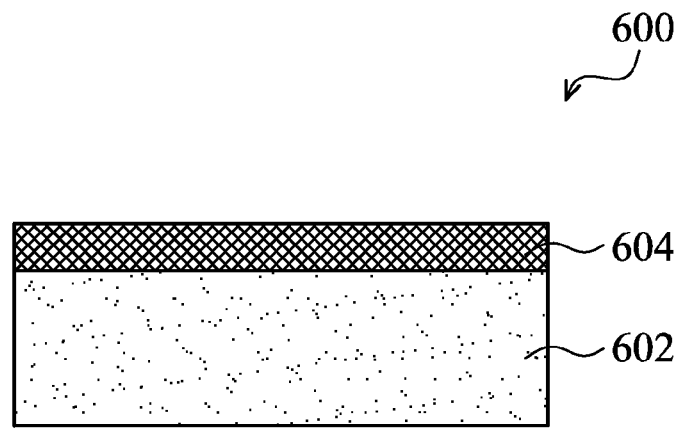
FIGS. 6A to 6I are cross-sectional views of an organic solar cell at various steps of fabrication according to the method of FIG. 5.
Figure 6B:
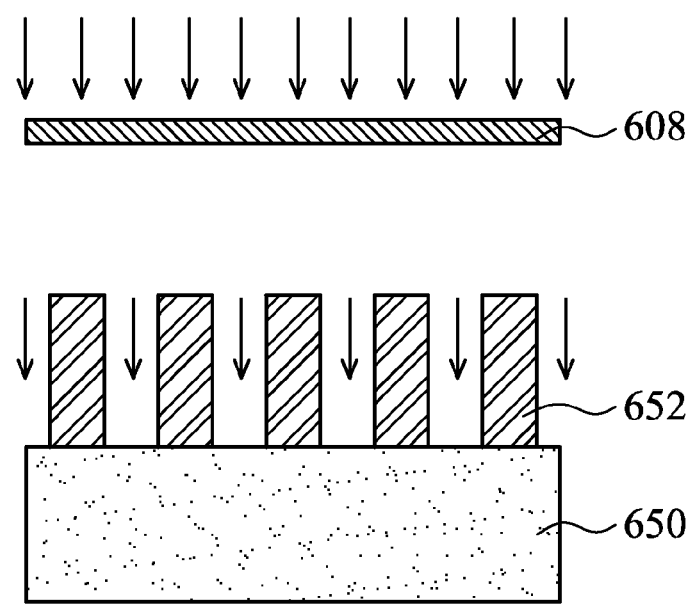
Figure 6C:
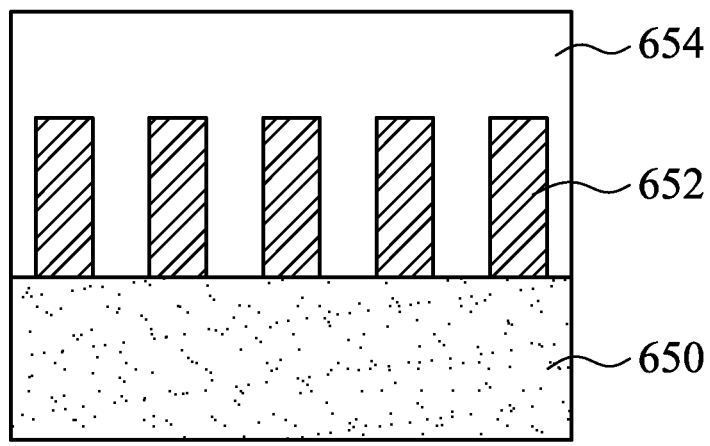

Method 500 continues with block 512 in which a stamp having a first pattern is formed. In FIG. 6B, another substrate 650 is provided. A patterned photoresist layer 652 is formed on the substrate 650 by using a mask 608 having a first pattern which is the same as the template. Thus, the patterned photoresist layer 652 may have the first pattern. The first pattern 702 may include various shapes, such as circles, triangles, rectangles, star shapes, polygons or straight lines, as shown in FIG. 7A-FIG. 7C. The size of the first pattern 702 is between about 1 nm and 1 mm. The first pattern 702 may be arranged periodically in one or two dimensions in a period between about 1 nm and 1 mm, as shown in FIG. 7D-FIG. 7E. The substrate 650 and patterned photoresist layer 652 may include materials similar to the substrate 250 and patterned photoresist layer 252 or any other suitable materials. The patterned photoresist layer 652 may be formed by various suitable lithography techniques, such as electron beam writing, ion beam writing, photolithography, immersion lithography or any other suitable patterning techniques. In FIG. 6C, a stamp 654 is formed on the patterned photoresist layer 652 by using the patterned photoresist layer 652 as a template. The stamp 654 is formed by filling a solution of stamp materials into the patterned photoresist layer 652 and curing the stamp materials. The stamp 654 may have the first pattern which is the same as the patterned photoresist layer 652. The stamp 654 may include polydimethylsiloxane (PDMS), UV-curable liquids, water-soluble polymers, polyurethane (PU), or any other suitable materials curable by light, heat or a combination thereof.

Figure 6D:
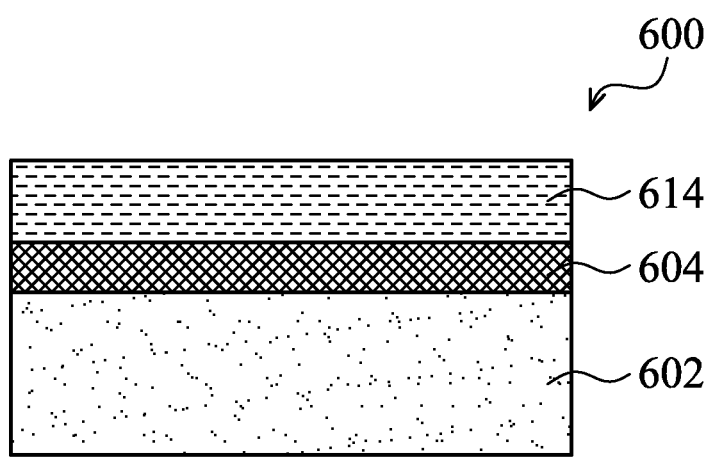

Method 500 continues with block 514 in which a hole transport layer is formed on the first electrode. Referring to FIG. 6D, a hole transport layer 614 is formed on the first electrode 604. The hole transport layer 614 may be formed by various suitable deposition methods, such as doctor blade coating, roll coating, jet-ink printing, screen printing or any other suitable coating methods. The thickness of the hole transport layer 614 is between about 1 nm and 1 mm, preferably between about 10 nm and 100 µm.

Figure 6E:
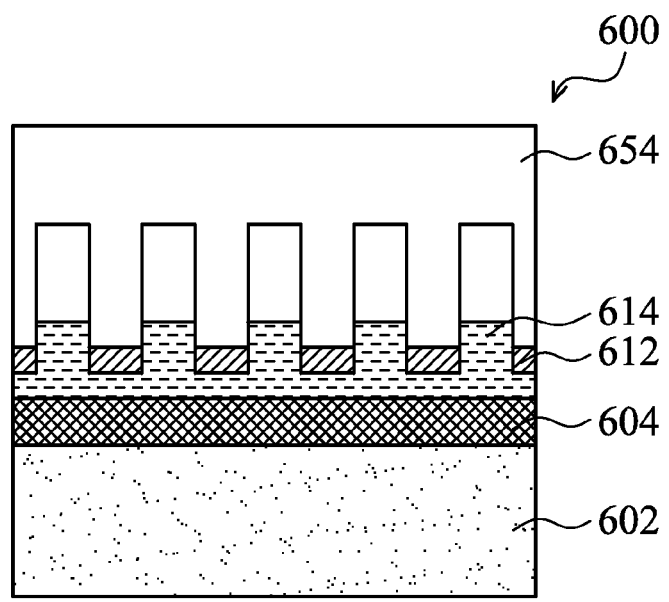

Method 500 continues with block 516 in which a patterned metal layer is formed in the hole transport layer. In FIG. 6E, the hole transport layer 614 is softened by heating. Heated metal nanoparticles 612 are adhered to the stamp 654 having the first pattern. Thereafter the stamp 654 is pressed to the softened hole transport layer 614. The metal nanoparticles 612 having the first pattern are imprinted into the softened hole transport layer 614. After cooling of the metal nanoparticles 612 and hole transport layer 614, a patterned metal layer 612 having the first pattern is formed in the hole transport layer 614. The patterned metal layer 612 is exposed by the hole transport layer 614.

Figure 6F:
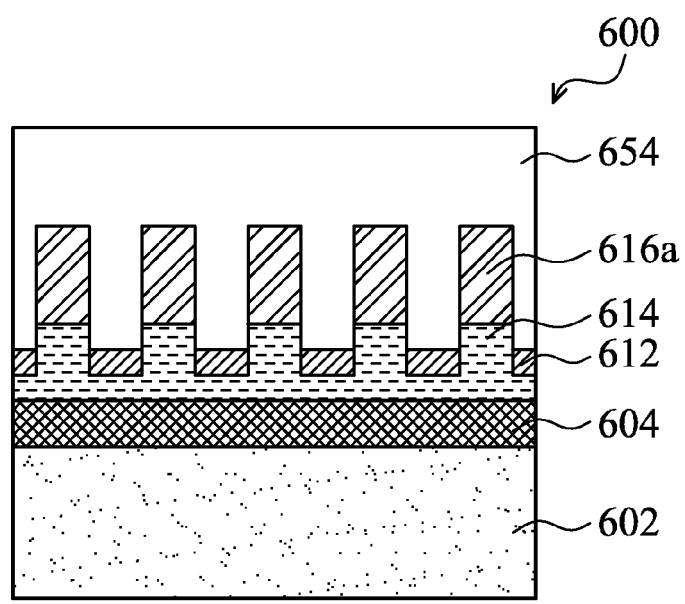
Figure 6G:
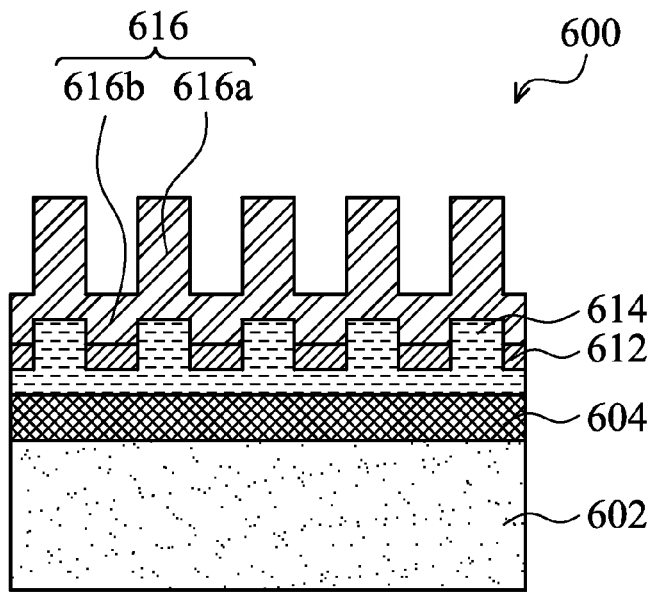

Method 500 continues with block 518 in which a first organic semiconductor film is formed on the hole transport layer. Referring to FIG. 6F, an organic semiconductor solution is filled into the interstice of the stamp 654 to form an organic semiconductor material 616a which has a second pattern. In FIG. 6G, the stamp 654 is removed, and then a thin organic semiconductor material 616b is deposited on the patterned metal layer 612 to form a first organic semiconductor film 616 which has the second pattern. Furthermore, the deposited thin organic semiconductor film 616b is preferably thinner than the filled organic semiconductor film 616a to maintain the second pattern of the first organic semiconductor film 616. Herein the organic semiconductor material 616a and the organic semiconductor material 616b may include the same materials which are similar to the first organic semiconductor film 216 described above. It should be noted that the second pattern of the first organic semiconductor film 616 is self-complementary to the first pattern of the patterned metal layer 612.

Figure 6H:
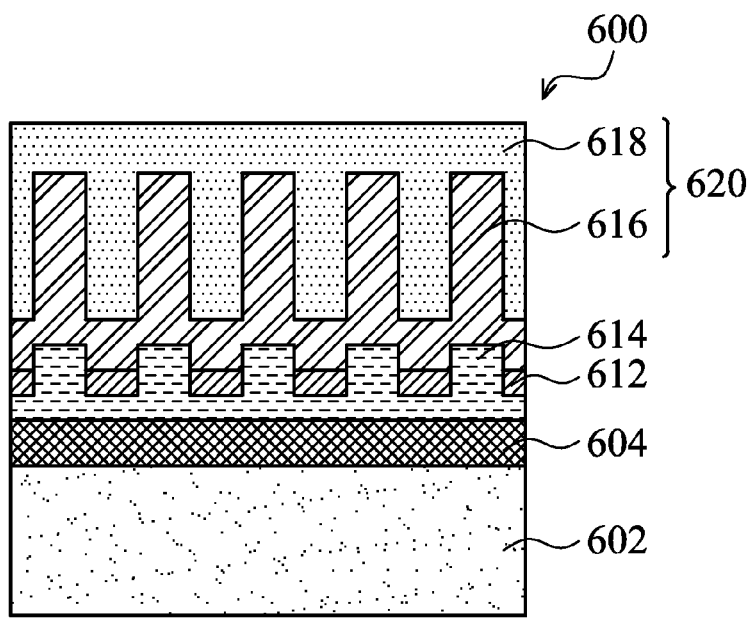
Figure 6I:
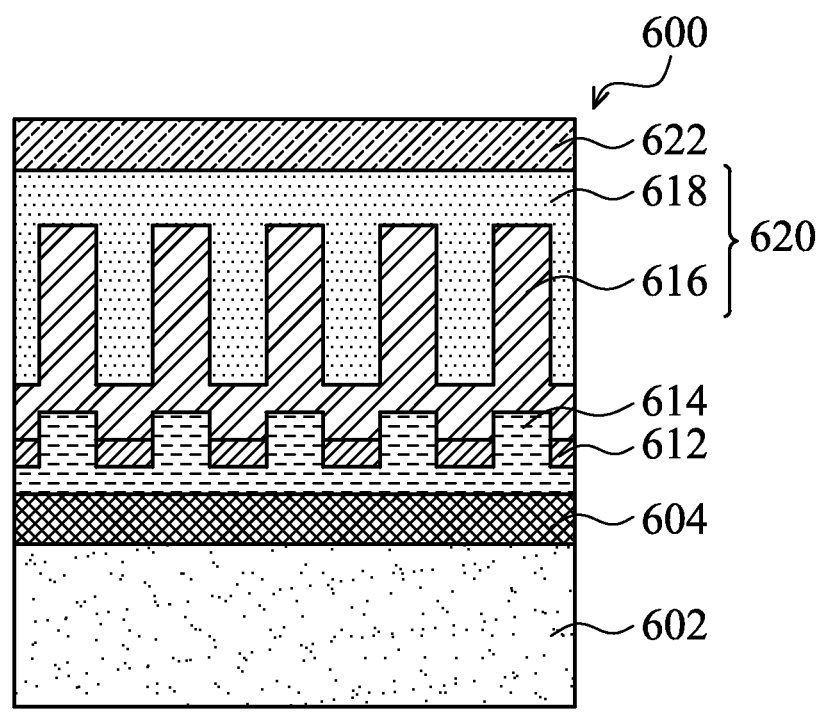

Method 500 continues with block 520 in which a second organic semiconductor film is formed on the first organic semiconductor film. In FIG. 6H, a second organic semiconductor film 618 is deposited on the first organic semiconductor film 616 and completely covers it. The second organic semiconductor film 618 may include a similar material with the second organic semiconductor film 218 described above as well as be formed by a similar technique. The first organic semiconductor film 616 and the second organic semiconductor film 618 are interlocked. Furthermore, the first pattern of the second organic semiconductor film 618 is self-aligned to the first pattern of the patterned metal layer 612. At least one of the first organic semiconductor film 616 or second organic semiconductor film 618 may include a light-absorbing material. In one embodiment, the first organic semiconductor film 616 is n-type while the second organic semiconductor film 618 is p-type. In another embodiment, the first organic semiconductor film 616 is p-type while the second organic semiconductor film 618 is n-type. An active layer 620 consists of the first organic semiconductor film 616 and the second organic semiconductor film 618.

Finally method 500 continues with block 522 in which a second electrode is formed on the active layer. In FIG. 6J, a second electrode 622 is formed on the active layer 620 and a complete organic solar cell 600 is formed. The second electrode 622 may include a similar material with the first electrode 222 described above as well as be formed by a similar technique.

The present invention achieves different advantages in various embodiments disclosed herein. However, it is understood that different embodiments offer different advantages, and that no particular advantage is necessary required for all embodiments. For example, the present disclosed method provides a novel structure for the organic solar cell. The solar cell has a patterned metal layer which has a pattern complementary to and aligned to/interlocked with the patterns of the two organic semiconductor films of opposite conductive types of the active layer. Thus, the configuration of the light-absorbing materials of the active layer may correspondingly aligned to the specific locations where the magnetic field is enhanced by the localized surface plasmons excited by the patterned metal layer. Thus, the light-absorbing efficiency of the active layer and the generation of the photocurrent may be increased; as a result, the photoelectric conversion efficiency of the organic solar cell may achieve maximum efficiency. Furthermore, the methods disclosed herein provide a simple process of forming the organic solar cell. The pattern of the active layer can be directly aligned with or self-aligned to the region of the patterned metal layer such that it effectively avoids and or reduces the complexity of the process. Thus, the organic solar cell device disclosed herein is both easily formed and cost-effective.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic solar cell, comprising:
   a substrate having a first electrode thereon;
   a hole transport layer overlying the first electrode;
   a metal layer having a first pattern in the hole transport layer;
   an active layer, comprising:
      a first organic semiconductor film having a second pattern complementary to the first pattern and overlying the metal layer and the hole transport layer; and
      a second organic semiconductor film having the first pattern substantially aligned to the first pattern of the metal layer and overlying the first organic semiconductor film, wherein the first organic semiconductor film and the second organic semiconductor have opposite conductive types;
      wherein the first organic semiconductor film and the second organic semiconductor film are interlocked; and
   a second electrode overlying the active layer.

2. The organic solar cell as claimed in claim 1, wherein the first electrode comprises a transparent conductive layer comprising tin oxide, zinc oxide, indium tin oxide, indium zinc oxide, antimony tin oxide, fluorine doped tin oxide, aluminum doped zinc oxide or combinations thereof.

3. The organic solar cell as claimed in claim 1, wherein the metal layer comprises gold, silver, copper, aluminum, chromium, alloys thereof or combinations thereof.

4. The organic solar cell as claimed in claim 1, wherein first pattern has a size between about 1 nm and 1 mm.

5. The organic solar cell as claimed in claim 1, wherein the first pattern comprises circles, triangles, rectangles, star shapes, polygons or straight lines which are arranged in one or two dimensions.

6. The organic solar cell as claimed in claim 1, wherein the first pattern is arranged periodically in the period from about 1 nm to 1 mm.

7. The organic solar cell as claimed in claim 1, wherein the hole transport layer comprises 3,4-polyethylenedioxythiophene: polystyrene sulfonate (PEDOT: PSS), poly[9,9-dioctylfluorene-co-(bis-N,N'-(3-carboxyphenyl)-bis-N,N'-phenylbenzidine)] (BFA), polyaniline (PAN), polyphenylenevinylene (PPV), N,N'-bis-(3-methylphenyl)-N,N'-diphenyl-[1,1'-biphenyl]-4,4'-diamine (TPD), N-N'-di (naphthalene-1-yl)-N,N'-diphenylbenzidine (NPB), N,N'-bis-(3-methylphenyl)-N,N'-bis-(phenyl)-9,9-spirobifluorene (spiro-TPD), N-N'-Bis(naphthalen-1-yl)-N,N'-bis(phenyl)-9,9-spirobifluorene (spiro-NPB) or combinations thereof.

8. The organic solar cell as claimed in claim 1, wherein the thickness of the hole transport layer is thicker than the metal layer.

9. The organic solar cell as claimed in claim 1, wherein the metal layer is completely covered by the hole transport layer.

10. The organic solar cell as claimed in claim 1, wherein the hole transport layer exposes the metal layer.

11. The organic solar cell as claimed in claim 1, wherein at least one of the first organic semiconductor films or the second organic semiconductor film comprises a light-absorbing material.

12. The organic solar cell as claimed in claim 11, wherein the light-absorbing material comprises poly(3-hexylthiophene) (P3HT), (6,6)-phenyl C61-butyric acid methyl ester (PCBM), Poly(2-methoxy-5-(2-ethylhexyloxy)-1,4-phenylenevinylene (MEHPPV), poly[2-methoxy-5-(3,7-dimethyloctyloxy)-1,4-phenylenevinylene] (MDMO-PPV), poly [N-9'-heptadecanyl-2-7-carbazole-alt-5,5-(4'-7'-di-2'-1',3'-benzothiadiazole)] (PCDTBT), poly[2,6-(4,4-bis(2-ethylhexyl)-4H-cyclopenta[2,1-b:3,4-b']dithiophene)-alt-4,7-(2,1,3-benzothiadiazole)]) (PCPDTBT), poly [4,4-bis(2-ethylhexyl)-4H-cyclopenta[2,1-b:3,4-b']dithiophene-2,6-diyl-alt-4,7-bis(2-thienyl)-2,1,3-benzothiadiazol5',5"-diyl] (PCPDTTBTT) or combinations thereof.

13. The organic solar cell as claimed in claim 1, wherein the first organic semiconductor film is p-type while the second organic semiconductor film is n-type.

14. The organic solar cell as claimed in claim 1, wherein the first organic semiconductor film is n-type while the second organic semiconductor film is p-type.

15. A method for forming an organic solar cell, comprising:
providing a substrate having a first electrode thereon;
forming a hole transport layer and a metal layer on the first electrode, wherein the metal layer has a first pattern;
forming an active layer on the hole transport layer, comprising:
 forming a first organic semiconductor film having a second pattern complementary to the first pattern on the metal layer and the hole transport layer; and
 forming a second organic semiconductor film having the first pattern substantially aligned to the first pattern of the metal layer on the first organic semiconductor film,
 wherein the first organic semiconductor film and the second organic semiconductor have opposite conductive types;
 wherein the first organic semiconductor film and the second organic semiconductor film are interlocked; and
forming a second electrode on the active layer.

16. The method as claimed in claim 15, wherein the first electrode comprises a transparent conductive layer comprising tin oxide, zinc oxide, indium tin oxide, indium zinc oxide, antimony tin oxide, fluorine doped tin oxide, aluminum doped zinc oxide or combinations thereof.

17. The method as claimed in claim 15, wherein forming the metal layer comprises:
forming a photoresist layer having a second pattern on the first electrode;
depositing a non-patterned metal layer to cover the first electrode and the photoresist layer; and
removing the photoresist layer and the metal layer formed thereon to form the metal layer having the first pattern.

18. The method as claimed in claim 17, wherein the metal layer having the first pattern and the first electrode are completely covered by the hole transportlayer.

19. The method as claimed in claim 18, wherein the forming of the first organic semiconductor film comprises:
forming a non-patterned organic semiconductor film on the hole transport layer and softening the non-patterned organic semiconductor film by heating;
forming a stamp having the first pattern by using the photoresist as a template;
pressing the stamp to the softened organic semiconductor film; and
removing the stamp to form the first organic semiconductor film having the second pattern.

20. The method as claimed in claim 19, wherein the stamp comprises polydimethylsiloxane (PDMS), UV-curable liquids, water-soluble polymers, polyurethane, any other suitable materials are curable by light or heat or combinations thereof.

21. The method as claimed in claim 15, wherein the forming of the metal layer comprises:
forming a stamp having the first pattern;
adhering metal nonoparticles on the stamp; and
forming the metal layer having the first pattern by imprinting the stamp having metal nanoparticles thereon.

22. The method as claimed in claim 21, wherein the stamp is molded by a template using a photoresist layer having the second pattern.

23. The method as claimed in claim 21, wherein the stamp comprises polydimethylsiloxane (PDMS), UV-curable liquids, water-soluble polymers, polyurethane, any other suitable material curable by light or heat or combinations thereof.

24. The method as claimed in claim 21, wherein the stamp, on which the metal nanoparticles are adhered to, is directly imprinted onto the first electrode.

25. The method as claimed in claim 24, further comprises surface treating of the first electrode to enhance the adhesion between the metal nanoparticles and the first electrode.

26. The method as claimed in claim 24, further comprising:
removing the stamp after forming the metal layer; and
forming the hole transport layer to completely cover the metal layer.

27. The method as claimed in claim 26, wherein the forming of the first organic semiconductor film comprises:
   forming a non-patterned organic semiconductor film on the hole transport layer;
   using the stamp to adhere an organic semiconductor solution;
   imprinting the stamp adhered with the organic semiconductor solution onto the non-patterned organic semiconductor film; and
   removing the stamp to form the first organic semiconductor film having the second pattern, wherein the non-patterned organic semiconductor film and the organic semiconductor solution are formed of the same materials.

28. The method as claimed in claim 24, further comprising, after forming the metal layer, holding the stamp on the first electrode and forming the hole transport layer in interstice of the stamp.

29. The method as claimed in claim 28, wherein the forming of the first organic semiconductor film comprises:
   filling an organic semiconductor material into interstice of the stamp;
   removing the stamp; and
   thereafter depositing the organic semiconductor material on the metal layer to form the first organic semiconductor film having the second pattern.

30. The method as claimed in claim 29, wherein the first pattern of the second organic semiconductor film is self-aligned to the first pattern of the metal layer.

31. The method as claimed in claim 21, further comprising:
   forming the hole transport layer on the first electrode;
   softening the hole transport layer by heating; and
   imprinting the metal nanoparticles to the softened hole transport layer to form the metal layer having the first pattern by using the stamp.

32. The method as claimed in claim 31, wherein forming the first organic semiconductor film comprises:
   filling an organic semiconductor material into the interstice of the stamp;
   removing the stamp; and
   thereafter depositing the organic semiconductor material on the metal layer to form the first organic semiconductor film having the second pattern.

33. The method as claimed in claim 32, wherein the first pattern of the second organic semiconductor film is self-aligned to the first pattern of the metal layer.

34. The method as claimed in claim 15, wherein the metal layer comprises gold, silver, copper, aluminum, chromium, alloys thereof or combinations thereof.

35. The method as claimed in claim 15, wherein first pattern has a size between about 1 nm and 1 mm.

36. The method as claimed in claim 35, wherein the first pattern comprises circles, triangles, rectangles, star shapes, polygons or straight lines arranged in one or two dimensions.

37. The method as claimed in claim 35, wherein the first pattern is arranged periodically in a period from about 1 nm to 1 mm.

38. The method as claimed in claim 15, wherein the thickness of the hole transport layer is thicker than the metal layer.

39. The method as claimed in claim 15, wherein at least one of the first organic semiconductor films and second organic semiconductor film comprises a light-absorbing material.

40. The method as claimed in claim 39, wherein the light-absorbing material comprises poly(3-hexylthiophene) (P3HT), (6,6)-phenyl C61-butyric acid methyl ester (PCBM), Poly(2-methoxy-5-(2-ethylhexyloxy)-1,4-phenylenevinylene (MEHPPV), poly[2-methoxy-5-(3,7-dimethyloctyloxy)-1,4-phenylenevinylene] (MDMO-PPV), poly[N-9'-heptadecanyl-2-7-carbazole-alt-5,5-(4'-7'-di-2'-1',3'-benzothiadiazole)] (PCDTBT), poly[2,6-(4,4-bis(2-ethylhexyl)-4H-cyclopenta[2,1-b:3,4-b']dithiophene)-alt-4,7-(2,1,3-benzothiadiazole)]) (PCPDTBT), poly[4,4-bis(2-ethylhexyl)-4H-cyclopenta[2,1-b:3,4-b']dithiophene-2,6-diyl-alt-4,7-bis(2-thienyl)-2,1,3-benzothiadiazol5',5"-diyl] (PCPDTTBTT) or combinations thereof.

41. The method as claimed in claim 15, wherein the first organic semiconductor film is p-type while the second organic semiconductor film is n-type.

42. The method as claimed in claim 15, wherein the first organic semiconductor film is n-type while the second organic semiconductor film is p-type.

* * * * *